(12) United States Patent
Kinoshita et al.

(10) Patent No.: US 9,136,155 B2
(45) Date of Patent: Sep. 15, 2015

(54) METHOD AND DEVICE FOR PROCESSING WAFER SHAPED ARTICLES

(75) Inventors: Kei Kinoshita, Villach (AT); Philipp Engesser, Lindau (DE)

(73) Assignee: LAM RESEARCH AG, Villach (AT)

( * ) Notice: Subject to any disclaimer, the term of this patent is extended or adjusted under 35 U.S.C. 154(b) by 972 days.

(21) Appl. No.: 13/298,581

(22) Filed: Nov. 17, 2011

(65) Prior Publication Data

US 2013/0127102 A1    May 23, 2013

(51) Int. Cl.
*H01L 21/683* (2006.01)
*H01L 21/687* (2006.01)
*B25B 5/06* (2006.01)

(52) U.S. Cl.
CPC ...... *H01L 21/6838* (2013.01); *H01L 21/68728* (2013.01); *B25B 5/061* (2013.01); *Y10T 29/49998* (2015.01)

(58) Field of Classification Search
CPC .............................. B25B 5/061; B23Q 1/0018
USPC ...................................... 269/21, 903, 900, 20
See application file for complete search history.

(56) References Cited

U.S. PATENT DOCUMENTS

| | | | |
|---|---|---|---|
| 4,313,783 A | 2/1982 | Davies et al. | |
| 4,903,717 A | 2/1990 | Sumnitsch | |
| 5,513,668 A * | 5/1996 | Sumnitsch | 134/157 |
| 5,975,740 A | 11/1999 | Lin et al. | |
| 6,184,972 B1 * | 2/2001 | Mizutani et al. | 355/72 |
| 6,702,900 B2 | 3/2004 | Yeh et al. | |
| 7,988,818 B2 | 8/2011 | Engesser | |
| 8,608,146 B2 * | 12/2013 | Brugger et al. | 269/296 |
| 2011/0148022 A1 * | 6/2011 | Brugger et al. | 269/296 |
| 2011/0151675 A1 * | 6/2011 | Frank et al. | 438/748 |
| 2011/0254236 A1 * | 10/2011 | Brugger et al. | 279/125 |
| 2013/0127102 A1 * | 5/2013 | Kinoshita et al. | 269/20 |

FOREIGN PATENT DOCUMENTS

WO    2011/073840 A2    6/2011

OTHER PUBLICATIONS

International Search Report, dated Feb. 25, 2013, from corresponding PCT application.

* cited by examiner

*Primary Examiner* — Lee D Wilson
(74) *Attorney, Agent, or Firm* — Young & Thompson

(57) ABSTRACT

A method and device for treating a wafer-shaped article utilizes a novel clamping mechanism, which permits wafer shift to be performed with reduced wear to the chuck pins. A wafer is rotated on a spin chuck that has a plurality of pins positioned at a periphery of the wafer shaped article. The pins each have a head portion which, in a service position, extends radially inwardly of and above the wafer. Gas is supplied onto a surface of the wafer facing the spin chuck at a flow rate sufficient to displace the wafer upwardly into contact with the head portions of the pins. This serves to clamp the wafer against the head portions of the pins. However, the pins contact the wafer only on upwardly oriented wafer surfaces and the wafer is supported from below solely by the gas flow.

15 Claims, 2 Drawing Sheets

METHOD AND DEVICE FOR PROCESSING WAFER SHAPED ARTICLES

BACKGROUND OF THE INVENTION

The invention relates to methods and devices for processing wafer-shaped articles, such as semiconductor wafers.

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Such chucks include a circular series of pins positioned at the edge of the wafer. Such pins center the wafer on the chuck and limit its lateral movement. Such pins may in some designs also hold the wafer at a certain distance above the chuck. For example, in commonly-owned US Patent Pub. No. 2011/0151675 (corresponding to WO 2011/073840), the pins have a mushroom-shaped head that serves to grip the wafer edge and maintain the wafer at a fixed distance above the surface of the chuck.

As discussed in that application, certain regions of the wafer edge, including those contacted by the pins, might in some processes experience different process conditions than other regions of the wafer edge. To counteract that, it is desirable to perform a "wafer shift" during such processing, that is, to cause the wafer to rotate relative to the circular series of pins over a limited angular range.

In US 2011/0151675, wafer shift is performed by briefly accelerating or decelerating the spin chuck during processing, which in turn results in relative movement between the chuck body and the incorporated ring gear that is provided to move the pins from their radially inward service position to their radially outward loading and unloading position, owing to the inertia of the ring gear. That relative movement of the ring gear and the chuck thus causes the pins to briefly slacken their grip on the wafer edge, thereby permitting wafer shift to occur.

However, the relative movement between the wafer and the pins as occurs during conventional wafer shift causes excessive wear on the pins and significantly reduces their service life. Furthermore, prematurely worn pins do not grip the wafer evenly, and can result in increased incidence of wafer breakage at the relatively high rpm used in such spin chucks.

SUMMARY OF THE INVENTION

The present inventors have discovered new methods and devices for mitigating the problem of pin wear caused by wafer shift, and in so doing have devised methods and apparatus of more general application for supporting wafer-shaped articles differently than in devices in current use.

Thus, in one aspect, the present invention relates to a method for treating a wafer-shaped article, comprising rotating a wafer shaped article on a spin chuck that comprises a plurality of pins positioned at a periphery of the wafer shaped article. The plurality of pins each comprise a head portion which, in a service position of the pins, extends radially inwardly of and above the wafer shaped article. Gas is supplied onto a surface of the wafer shaped article facing the spin chuck at a flow rate sufficient to displace the wafer shaped article upwardly into contact with the head portions of the pins. The wafer shaped article is thereby clamped against the head portions of the pins. The pins contact the wafer shaped article only on upwardly oriented wafer surfaces and the wafer shaped article is supported from below solely by the gas.

In preferred embodiments of the method according to the present invention, the flow rate of gas supplied onto the surface of the wafer shaped article facing the spin chuck is reduced to a rate at which the wafer shaped article is lowered out of contact with the plurality of pins, thereby to permit relative rotation of the wafer shaped article and the plurality of pins.

In preferred embodiments of the method according to the present invention, prior to rotating the wafer shaped article on the spin chuck, the plurality of pins is moved to a loading position in which the head portions of the pins are positioned entirely outside a diameter of the wafer shaped article, thereby to permit loading of the wafer shaped article onto the spin chuck.

In preferred embodiments of the method according to the present invention, gas is supplied to an underside of the wafer shaped article at a reduced flow rate while the plurality of pins are in the loading position, so as to support the wafer shaped article from below without raising it to a level at which it makes contact with the head portions of the plurality of pins when the plurality of pins are in the service position.

In preferred embodiments of the method according to the present invention, the plurality of pins each comprises a neck portion extending downwardly from a respective head portion, the neck portions in a service position of the pins being positioned entirely outside a diameter of the wafer shaped article, such that the wafer shaped article when centered on the spin chuck does not contact the neck portions of the plurality of pins.

In preferred embodiments of the method according to the present invention, the flow rate sufficient to displace the wafer shaped article upwardly into contact with the head portions of the pins is 100-500 l/min, preferably 200-400 l/min, and more preferably about 300 l/min.

In preferred embodiments of the method according to the present invention, the flow rate at which the wafer shaped article is lowered out of contact with the plurality of pins is 5-40 l/min, preferably 10-30 l/min and more preferably 10-20 l/min.

In preferred embodiments of the method according to the present invention, when the wafer shaped article is clamped against the head portions of the pins, the spin chuck is rotated at a speed of 1000-1800 rpm, preferably 1200-1600 rpm, and more preferably about 1500 rpm; and when the wafer shaped article is lowered out of contact with the plurality of pins, the spin chuck is rotated at a speed of 100-800 rpm, preferably 200-600 rpm, more preferably 300-500 rpm, and most preferably about 400 rpm.

In preferred embodiments of the method according to the present invention, the gas is nitrogen.

In another aspect, the present invention relates to a device for treating a wafer-shaped article, comprising a spin chuck adapted to receive a wafer shaped article of a predetermined diameter centered on an axis of rotation of the spin chuck. The spin chuck comprises a circular series of pins movable from a radially outward loading and unloading position to a radially inward service position. A gas supply provides gas to the spin chuck so as to impinge on a surface of the wafer shaped article facing the spin chuck at a predetermined flow rate. Each of the pins comprises a head portion that extends within the predetermined diameter in the service position and a neck portion that is positioned outside the predetermined diameter in the service position. The head portions of the pins confine a wafer shaped article against upward displacement in a clamped position during supply of gas at the predetermined flow rate. The neck portions of the pins do not oppose movement of a wafer shaped article downward from the clamped position.

In preferred embodiments of the device according to the present invention, the device is equipped with a microprocessor that controls the gas supply so as to provide gas to the spin chuck so as to impinge on a surface of a wafer shaped article facing the spin chuck at each of the predetermined flow rate and a second flow rate that is reduced relative to the predetermined flow rate and at which a wafer shaped article is lowered relative to the circular series of pins.

In preferred embodiments of the device according to the present invention, the predetermined flow rate is 100-500 l/min, preferably 200-400 l/min, and more preferably about 300 l/min. The second flow rate is 5-40 l/min, preferably 10-30 l/min and more preferably 10-20 l/min.

In preferred embodiments of the device according to the present invention, the circular series of pins is movable radially inwardly of said service position to a centering position at which said neck portions of said pins adjoin said predetermined diameter.

In preferred embodiments of the device according to the present invention, the microprocessor controls a speed of rotation of the spin chuck such that the spin chuck is rotated at a first speed during supply of gas at the predetermined flow rate and the spin chuck is rotated at a second speed, less than the first speed, during supply of gas at the second flow rate.

In preferred embodiments of the device according to the present invention, the first speed is 1000-1800 rpm, preferably 1200-1600 rpm, and more preferably about 1500 rpm. The second speed is 100-800 rpm, preferably 200-600 rpm, more preferably 300-500 rpm, and most preferably about 400 rpm.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
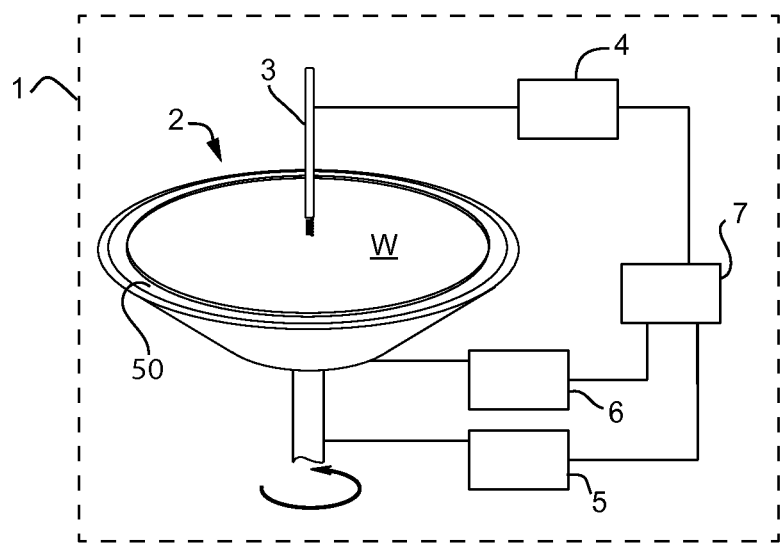
FIG. 1 is a schematic perspective view of a device 1 for single wafer wet processing, according to an embodiment of the present invention.

In FIG. 1 wafer W is supported on spin chuck 2 from below solely by a cushion of gas, and is clamped from above the spin chuck 2 by pins that will be described hereinafter. Processing liquid is dispensed onto the wafer through dispenser 3 from a supply of processing liquid 4. A motor 5 drives the spin chuck in rotation, and a gas supply 6 provides gas so as to impinge on an underside of wafer W. Processing liquid supply 4, motor 5 and gas supply 6 are controlled via a microprocessor 7, as described more fully herein. Typically, a process module 1 for single wafer wet processing may include a group of spin chucks 2 operating in parallel, and controlled by a common microprocessor 7.

Ring 50 is configured to prevent processing liquid from treating the wafer's underside or more than a predetermined amount of the wafer's edge surfaces, as described more fully in commonly-owned US Patent Pub. No. 2011/0151675 (corresponding to WO 2011/073840).

Figure 2:
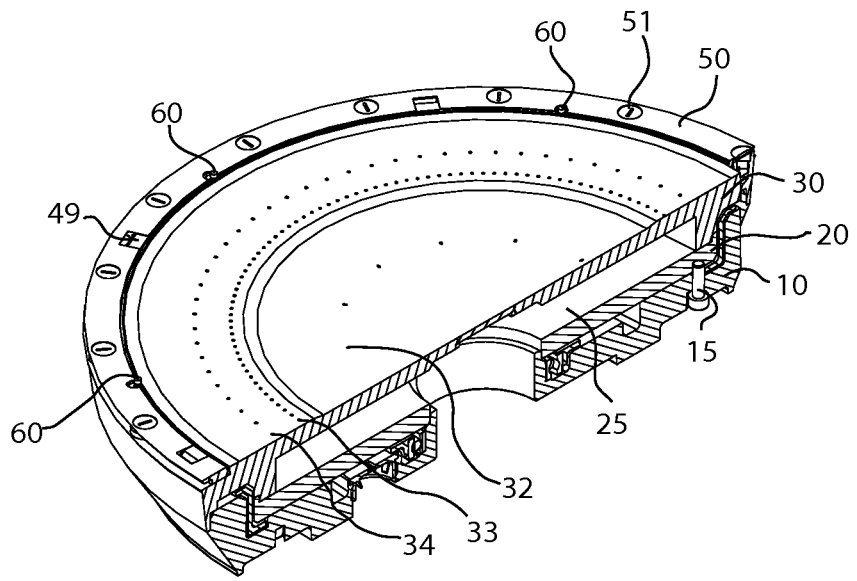
FIG. 2 is a more detailed perspective view, partly in section, of the spin chuck of FIG. 1.

As shown in FIG. 2 the spin chuck 1 includes three base body elements: a lower part 10, a middle part 20, and an upper part 30. The lower and middle base body elements are preferably secured together with screws, one of which is shown at 15.

Ring 50 is mounted to the chuck by mounting screws 51. The ring has openings to allow clamping pins 60 to extend through ring 50 and above the upper plane of the chuck. Six pockets 49 are formed into the ring so that an edge-contact-only gripper (e.g. as described in U.S. Pat. No. 5,762,391) can remove a wafer from the chuck or place a wafer onto the chuck.

Between the middle part 20 and the upper part 30 there is space 25 that can be filled with clean pressurized gas (e.g. nitrogen). Pressurized gas in space 25 flows through the three concentrically arranged arrays of nozzles: the inner nozzle array 32, the middle nozzle array 33, and the outer nozzle array 34. The gas exhausted through the nozzles 32, 33, 34 provides a gas cushion, on which the wafer floats and may also assist in securing the wafer to the chuck via the Bernoulli principle.

Figure 3:
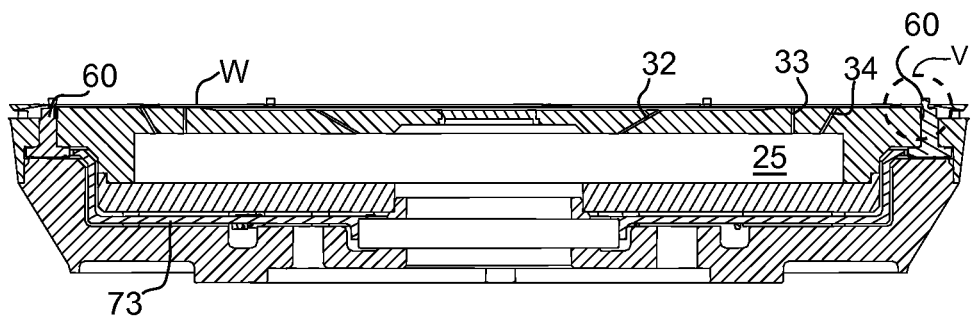
FIG. 3 is an axial cross-section of the spin chuck of FIG. 1.

In FIG. 3, there is depicted a toothed gear ring 73, which drives the clamping pins 60 in unison, via meshing teeth provided at the base of each pin 60. The toothed gear ring 73 is held in a closed position by springs (not shown). In the depicted embodiment, the spin chuck comprises a circular series of six clamping pins 60, although that number could be as few as three or as many as twelve.

Figure 4:
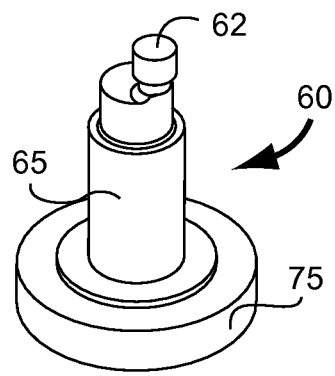
FIG. 4 is a perspective view of a pin 60 as shown in FIG. 3.

As shown in FIG. 4, pins 60 each have an enlarged head 62 that serves to clamp the wafer to the spin chuck 2 during its treatment. The ring 50 includes holes allowing the pins 60 to pass through the ring and pivot through its eccentric range of motion (see FIG. 3). The tooth gear 73 controls the movement of the pins from an unloading and loading position to a service position.

Figure 5A:
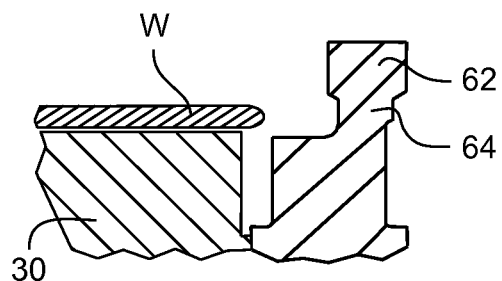
FIG. 5a is an enlarged view of detail V of FIG. 3, showing the pin 60 in its loading/unloading position.

In particular, in the loading and unloading position depicted in FIG. 5a, the pins 60 have been turned by the ring gear 73 such that the enlarged heads 64 lie entirely outside the diameter of the circle described by the periphery of the wafer W. Thus, in this position of pins 60, a wafer W can be loaded and unloaded from the chuck, for example by using an edge contact only gripper as described above.

During loading and unloading, a relatively low gas flow is supplied to the underside of the wafer W, which is sufficient to keep the underside of the wafer W out of contact with the spin chuck 2, but insufficient to lift the wafer above the level of the neck regions 64 of pins 60. This relatively low gas flow may be for example a flow of nitrogen gas of 5-40 liter/min, preferably 10-30 l/min and more preferably 10-20 l/min.

Figure 5B:
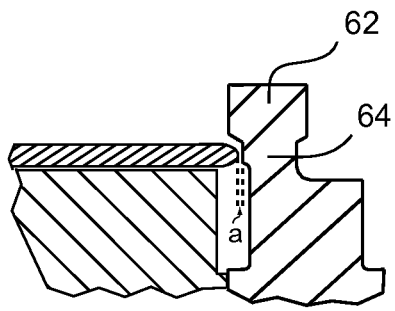
FIG. 5b is an enlarged view of detail V of FIG. 3, showing the pin 60 in its service position when the wafer W is not yet clamped against the head portion of the pin.

After a wafer W has been loaded onto the spin chuck 2, the pins 60 are turned in unison by ring gear 73 to their service position, as depicted in FIG. 5b. In this position, the head portions 62 of pins 60 project into the circle described by the outer periphery of the wafer W, that is, they overlap the wafer W from above.

However, pins 60 are unlike the pins 56 described in commonly-owned US Patent Pub. No. 2011/0151675 (corresponding to WO 2011/073840) in that, in the service position depicted in FIG. 5b, the neck portions 64 of pins 60 remain spaced from the wafer W by a small gap "a". The pins 60 therefore provide no subjacent support for the wafer W, nor do they contact the wafer W other than on upwardly inclined surfaces via the head portions 62.

Figure 5C:
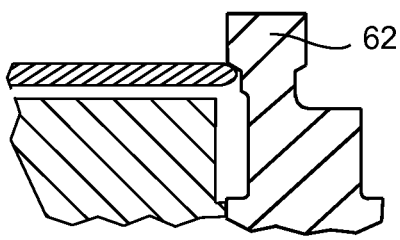
FIG. 5c is an enlarged view of detail V of FIG. 3, showing the pin 60 in its service position when the wafer W is clamped against the head portion of the pin.

Next, a higher flow rate of gas is supplied to the underside of the wafer W, sufficient to lift the wafer W relative to spin chuck 2, and clamp the wafer against the head portions 62 as depicted in FIG. 5c. In practice, it is preferred once again to use nitrogen gas, in this case at a flow rate of 100-500 l/min, preferably 200-400 l/min, and more preferably about 300 l/min. Wafer W is thereby held in a novel manner, inasmuch as it is not gripped by pins 60, but rather is clamped against pins 60 by the force of the subjacent gas flow.

Conversely, when the flow of gas is reduced to a level that no longer elevates the wafer, the pins 60 offer no resistance to the lowering of the wafer W, as the neck portions 64 of pins 60 make no contact with wafer W in the service position.

As noted above, this novel holding technique thus also provides an elegant mechanism to effect a wafer shift during processing of a wafer shaped article on the spin chuck. That is, independent of loading and unloading of the wafer W, a wafer shift can be effected simply by reducing the gas flow rate to the underside of the wafer W, to a level where the wafer W is lowered out of contact with the head portions 62 of pins 60, as depicted in FIG. 5b. As there is then no contact between the wafer W and the pins 60, relative rotation occurs therebetween owing to the inertia of the wafer W.

It will be appreciated that the extent of wafer shift can be adjusted by varying the rotational speed of the spin chuck during the time that the lower gas flow rate is applied to the wafer, as well as by varying the duration of the lower gas flow rate. For example, during normal processing when the wafer W is clamped against the pins 60 by a high gas flow, the spin chuck is often rotated at relatively high rpm of 1000-1800 rpm, preferably 1200-1600 rpm, and more preferably about 1500 rpm.

On the other hand, when the gas flow is reduced to lower the wafer W to the position shown in FIG. 5b so as to effect wafer shift, the rotational speed of the chuck is preferably also reduced to a speed of 100-800 rpm, preferably 200-600 rpm, more preferably 300-500 rpm, and most preferably about 400 rpm. For example, when the gas flow of nitrogen is reduced from a flow rate of 300 l/min (FIG. 5c) to 10 l/min (FIG. 5b) for 5 seconds, the amount of wafer shift as measured along the periphery of a 300 mm semiconductor wafer varied roughly linearly from about 5 mm when the spin chuck was rotated at 200 rpm to 35 mm when the spin chuck was rotated at 600 rpm.

The extent of wafer shift also varies inversely with the gas flow rate, such that a flow rate range of 10-30 l/min is most preferred during wafer shift, it being difficult to perform wafer shift reproducibly at lower flow rates whereas relatively little shift occurs at significantly higher flow rates.

The extent of wafer shift furthermore varies with the time of low rate gas flow, with a duration of from a few seconds to about 10 seconds being preferred. Below a few seconds not enough wafer shift occurs, whereas if wafer shift continues for significantly longer than 10 seconds, the extent of wafer shift can be too great, and the effect is poorly reproducible.

The invention claimed is:

1. A method for treating a wafer-shaped article, comprising:
    rotating a wafer shaped article on a spin chuck;
    said spin chuck comprising a plurality of pins positioned at a periphery of the wafer shaped article, said plurality of pins each comprising a head portion which, in a service position of said pins, extends radially inwardly of and above the wafer shaped article;
    supplying gas onto a surface of the wafer shaped article facing the spin chuck at a flow rate sufficient to displace the wafer shaped article upwardly into contact with the head portions of the pins, whereby the wafer shaped article is clamped against the head portions of the pins;
    wherein the pins contact the wafer shaped article only on upwardly oriented wafer surfaces and wherein the wafer shaped article is supported from below solely by said gas.

2. The method according to claim 1, further comprising reducing a flow rate of the gas supplied onto the surface of the wafer shaped article facing the spin chuck to a rate at which the wafer shaped article is lowered out of contact with the plurality of pins, thereby to permit relative rotation of the wafer shaped article and the plurality of pins.

3. The method according to claim 1, further comprising, prior to rotating the wafer shaped article on the spin chuck, moving the plurality of pins to a loading position in which the head portions of the pins are positioned entirely outside a diameter of the wafer shaped article, thereby to permit loading of the wafer shaped article onto the spin chuck.

4. The method according to claim 3, further comprising supplying gas to an underside of the wafer shaped article at a reduced flow rate while the plurality of pins are in the loading position, so as to support the wafer shaped article from below without raising it to a level at which it makes contact with the head portions of the plurality of pins when the plurality of pins are in the service position.

5. The method according to claim 1, wherein the plurality of pins each comprises a neck portion extending downwardly from a respective head portion, the neck portions in a service position of said pins being positioned entirely outside a diameter of the wafer shaped article, such that the wafer shaped article when centered on the spin chuck does not contact the neck portions of said plurality of pins.

6. The method according to claim 1, wherein the flow rate sufficient to displace the wafer shaped article upwardly into contact with the head portions of the pins is 100-500 l/min, preferably 200-400 l/min, and more preferably about 300 l/min.

7. The method according to claim 2, wherein the flow rate at which the wafer shaped article is lowered out of contact with the plurality of pins is 5-40 l/min, preferably 10-30 l/min and more preferably 10-20 l/min.

8. The method according to claim 2, wherein, when the wafer shaped article is clamped against the head portions of the pins, the spin chuck is rotated at a speed of 1000-1800 rpm, preferably 1200-1600 rpm, and more preferably about 1500 rpm; and when the wafer shaped article is lowered out of contact with the plurality of pins, the spin chuck is rotated at a speed of 100-800 rpm, preferably 200-600 rpm, more preferably 300-500 rpm, and most preferably about 400 rpm.

9. The method according to claim 1, wherein the gas is nitrogen.

10. A device for treating a wafer-shaped article, comprising:
    a spin chuck adapted to receive a wafer shaped article of a predetermined diameter centered on an axis of rotation of said spin chuck;
    said spin chuck comprising a circular series of pins movable from a radially outward loading and unloading position to a radially inward service position;
    a gas supply that provides gas to said spin chuck so as to impinge on a surface of a wafer shaped article facing said spin chuck at a predetermined flow rate;

wherein each of said pins comprises a head portion that extends within said predetermined diameter in said service position and a neck portion that is positioned outside said predetermined diameter in said service position, such that the head portions of said pins confine a wafer shaped article against upward displacement in a clamped position during supply of gas at said predetermined flow rate, and such that the neck portions of said pins do not oppose movement of a wafer shaped article downward from said clamped position.

11. The device according to claim 10, further comprising a microprocessor controlling the gas supply so as to provide gas to said spin chuck so as to impinge on a surface of a wafer shaped article facing said spin chuck at each of said predetermined flow rate and a second flow rate that is reduced relative to said predetermined flow rate and at which a wafer shaped article is lowered relative to said circular series of pins.

12. The device according to claim 11, wherein said predetermined flow rate is 100-500 l/min, preferably 200-400 l/min, and more preferably about 300 l/min; and wherein said second flow rate is 5-40 l/min, preferably 10-30 l/min and more preferably 10-20 l/min.

13. The device according to claim 10, wherein said circular series of pins movable radially inwardly of said service position to a centering position at which said neck portions of said pins adjoin said predetermined diameter.

14. The device according to claim 11, wherein said microprocessor controls a speed of rotation of said spin chuck such that the spin chuck is rotated at a first speed during supply of gas at said predetermined flow rate and the spin chuck is rotated at a second speed, less than said first speed, during supply of gas at said second flow rate.

15. The device according to claim 14, wherein said first speed is 1000-1800 rpm, preferably 1200-1600 rpm, and more preferably about 1500 rpm; and wherein said second speed is 100-800 rpm, preferably 200-600 rpm, more preferably 300-500 rpm, and most preferably about 400 rpm.

* * * * *